United States Patent [19]
Nordholt et al.

[11] Patent Number: 4,916,412
[45] Date of Patent: Apr. 10, 1990

[54] VOLTAGE-CONTROLLED OSCILLATOR USING A PHASE CONTROL LOOP FOR ESTABLISHING AN ACCURATE IDLING FREQUENCY AND TEMPERATURE STABILIZED CONTROL SENSITIVITY

[75] Inventors: Ernst H. Nordholt, Berkel en Rodenrios; Hendrikus C. Nauta, Nootdorp, both of Netherlands

[73] Assignee: Nederlandsch Octrooibureau, The Hague, Netherlands

[21] Appl. No.: 299,667

[22] Filed: Jan. 19, 1989

[30] Foreign Application Priority Data

Jan. 19, 1988 [NL] Netherlands .......................... 8800119

[51] Int. Cl.$^4$ ............................................... H03L 7/00
[52] U.S. Cl. ........................................ 331/34; 331/135; 331/176
[58] Field of Search .................... 331/25, 34, 135, 136, 331/176, 11

[56] References Cited

U.S. PATENT DOCUMENTS

3,614,649 10/1971 Gerig ...................................... 331/17
4,511,863 4/1985 Vandergraaf ........................... 332/18

FOREIGN PATENT DOCUMENTS

2043646 3/1971 Fed. Rep. of Germany .
2139039 2/1972 Fed. Rep. of Germany .

Primary Examiner—Eugene R. LaRoche
Assistant Examiner—Robert J. Pascal
Attorney, Agent, or Firm—Christie, Parker & Hale

[57] ABSTRACT

Voltage-controlled oscillator provided with a frequency-determining element and an oscillator loop having a phase-rotating network, in which the value of one or more elements depends on a control signal which is fed to a control input and with which the phase rotation and thereby the oscillator frequency can be changed. The oscillator is further provided with a phase control loop, at least comprising a phase-rotating network to the input of which the oscillator signal is fed, a phase detector to the two inputs of which the input signal and the output signal of said phase-rotating network are fed, and an amplifier which amplifies the output signal of the phase detector and feeds it to the control input of the phase-rotating network of the oscillator loop. The phase detector has an accurately known and temperature-independent input-output relation. The phase-rotating network of the phase control loop may be formed by the phase-rotating network of the oscillator loop (FIG. 2). Said oscillator loop may have at least two cascaded phase-rotating subnetworks, at least one of which has said phase control loop with phase detector and amplifier (FIGS. 3, 4, 5).

13 Claims, 4 Drawing Sheets

VOLTAGE-CONTROLLED OSCILLATOR USING A PHASE CONTROL LOOP FOR ESTABLISHING AN ACCURATE IDLING FREQUENCY AND TEMPERATURE STABILIZED CONTROL SENSITIVITY

BACKGROUND OF THE INVENTION

The invention relates to a voltage-controlled oscillator provided with a frequency-determining element and an oscillator loop having a phase-rotating (or phase-shifting) network, in which the value of one or more elements depends on a control signal which is fed to a control input and with which the phase rotation and thereby the oscillator frequency can be changed. Such a voltage-controlled oscillator is known in practice.

In such an oscillator the frequency is controllable by means of a control voltage or control current, and these oscillators are usually known as voltage-controlled oscillators or VCOs. Such an oscillator is in principle made up of an amplifier which is provided with the frequency-determining element, such as a crystal or LC circuit, and which preferably has a transfer function as frequency-independent as possible, to which amplifier a phase-rotating network is connected in cascade, and one or more loops which ensure the correct oscillating action. Such a phase-rotating network has a frequency-dependent transfer function and can be, for example, an all-pass or bandpass network, the variable elements of which are formed by, for example, the resistance of a field effect element, the transconductance of an active component or the capacitance of a so-called capacitance diode.

The controllability of the oscillator frequency is, for example, required for frequency modulation and frequency demodulation applications and in oscillators whose frequency must remain very stable. The natural frequency of the frequency-determining element, for example a crystal, depends on the temperature. Adjustment of the above-mentioned phase rotation in the network of the known oscillator with a control signal derived from a temperature sensor in such a way that there is compensation for the frequency variations caused by the temperature changes, produces a temperature-compensated oscillator or TCO.

The values of the adjustable elements in the phase-rotating network of these VCOs and TCOs are generally not known accurately, particularly if monolithic technology is employed. This means that accurately establishing the idling frequency of the oscillator in the absence of a control signal and establishing the sensitivity (the relationship between control signal and frequency change) is a great problem.

In order to cause the oscillator to oscillate at the idling frequency of the frequency-determining element, it is necessary to set the phase rotation in the phase-rotating network accurately to a value of 0 or $\pm\pi$. It is thereby assumed that the amplifier shows no (excess) phase shift other than due to an inversion or non-inversion of the signal. The excess phase shift of the amplifier is assumed to be included in the phase shift of the phase-rotating network.

These circuits therefore normally need one or more adjustments of the idling frequency and sensitivity. Even if through such an adjustment the frequency is set exactly to its idling value at a particular temperature and the sensitivity is set at the desired value, due to the fact that the elements of the phase-rotating network have a certain temperature dependence, frequency variations, which are not fully determined by the frequency-determining element, may occur with temperature, and the sensitivity may vary with temperature.

This frequency drift, which is not established by the frequency-determining element and is therefore difficult to forecast, and the fact, that the sensitivity is not accurately known, make it difficult to determine the correct voltage course for compensating for the frequency drift or for a linear and accurate frequency modulation at the control input of the oscillator. This makes one or more further adjustments necessary in order to obtain a satisfactory temperature compensation or an accurate and linear frequency modulation. Such adjustments are time-consuming and expensive. The phase-rotating network which is provided to permit control of the oscillator frequency also causes the phase noise behavior of the oscillator to deteriorate as a result of the noise generated by the network.

SUMMARY OF THE INVENTION

The object of the invention is to eliminate the above-mentioned problems and to provide a voltage-controlled oscillator of which the idling frequency and therefore the frequency drift—but also the sensitivity—are established entirely by the frequency-determining element, despite which the elements in the phase-rotating network do not have to meet any standards as regards accuracy and temperature dependence. It is also the object of the invention to eliminate the noise introduced by the phase-rotating network.

This is achieved according to the invention in a voltage-controlled oscillator of the type mentioned in the preamble by a phase control loop, at least comprising a phase-rotating network to the input of which the oscillator signal is fed, a phase detector to the two inputs of which the input signal and the output signal of said phase-rotating network are fed, and an amplifier which amplifies the output signal of the phase detector and feeds it to the control input of the phase-rotating network of the oscillator loop, the phase detector having an accurately known and temperature-independent input-output relation.

In this embodiment according to the invention, apart from the fact that the idling frequency—and therefore also the frequency drift—is determined entirely by the frequency-determining element, for example a crystal, the sensitivity is also accurately defined at the same time, despite any inaccurate and temperature-dependent elements in the phase-rotating network, on condition that the phase detector has a known and temperature-independent input-output relation. Such phase detectors are known in practice. This voltage-controlled oscillator according to the invention is therefore also excellent for monolithic integration. Moreover, the noise generated by the phase-rotating network is eliminated by the regulating action via the phase control loop, as a result of which the phase noise behavior of the oscillator is considerably better than that of the known VCO. This embodiment also provides the opportunity to generate two signals accurately in quadrature.

The invention is based on the idea that by means of an accurate and temperature-independent phase detector the inaccurate and temperature-dependent phase rotation in the phase-rotating network in the oscillator loop can be adjusted directly or indirectly to an accurately known value by feeding to the phase detector the input and output signals of said phase-rotating network or the input and output signals of a second phase-rotating network whose transfer function is precisely related to that of the phase-rotating network in the oscillator loop, and by adjusting the phase rotation in the oscillator, to a value determined by the phase detector, with the control signal obtained at the output of the phase detector via a high-gain amplifier. The adjustment of the idling frequency of the oscillator thus takes place automatically, and the regulating action converges because the frequency of the oscillator varies very little if the phase rotation changes, so that the oscillator frequency can serve as a reference in the control loop despite this change.

BRIEF DESCRIPTION OF THE DRAWINGS

The invention will be explained in greater detail with reference to a number of embodiments shown in the drawings, in which.

DETAILED DESCRIPTION OF THE PREFERRED EMBODIMENTS

Figure 1:
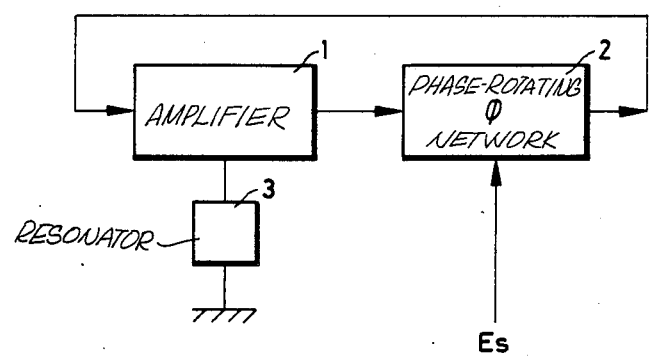
FIG. 1 gives a diagram of a known voltage-controlled oscillator.

In FIG. 1 reference number 1 indicates the amplifier provided with the frequency-determining element or resonator 3 with which the phase-rotating network 2 is provided in cascade in the oscillator. It is to be understood that this phase-rotating network 2 may comprise the phase rotation of the amplifier 1. The frequency-determining element may be, for example, a crystal or alternatively an LC circuit. The control signal Es (voltage or current) with which the frequency of the oscillator can be varied is fed in at the control input of the phase-rotating network.

Figure 2:
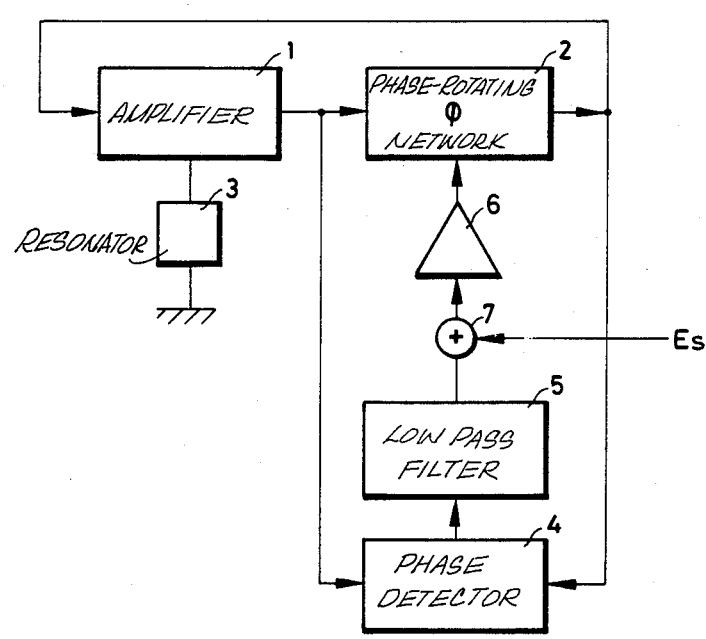
FIG. 2 gives a diagram of a first embodiment of the oscillator according to the invention.

The basic principle of the invention is shown in FIG. 2. The input and output signals of the phase-rotating network 2 of the VCO shown in FIG. 1 are fed to the inputs of a phase detector 4. The phases of the two signals are compared in this detector. The output signal of the phase detector is fed, after low-pass filtering in the filter 5, via a high-gain amplifier 6 to the control input of the phase-rotating network 2. The control signal Es coming from an external source can be presented to the input of the amplifier, via a suitable adder circuit 7. If the control signal is equal to zero (the idling situation), with a phase rotation of 0 or $\pm\pi$, depending on the design of the phase detector, an output signal which is equal to zero is obtained, regardless of the temperature and the phase-sensitivity of the phase detector. As a result of the considerable amplification of the phase detector signal, a control signal, such that the phase rotation acquires a value at which the phase detector 4 produces an output signal equal to zero, is automatically fed to the control input of the phase rotator 2. Since the frequency of the oscillator changes only slightly as a result of a relatively large phase rotation in the network 2, the control process converges in such a way that for the natural frequency of the frequency-determining element the phase rotation is virtually equal to 0 or $\pm\pi$, with the advantage that the oscillator frequency no longer depends on the inaccuracy and temperature sensitivity of the elements in the phase-rotating network, but only on the characteristics of the frequency-determining element. Feeding a control signal to the adder circuit 7 for the amplifier leads automatically to the production, in the phase-rotating network, of a phase shift corresponding to an output signal of the phase detector which is equal in size but opposite in sign to the control signal. For, the input voltage and input current of the amplifier must remain equal to zero if the gain is high. Since at the input of the amplifier the total signal is regulated to zero, the phase difference between input and output signals of the phase-rotating network cannot vary within the band width of the phase control loop, which is determined by the loop gain and the band width of the low-pass filter. This means that the noise generated by the phase-rotating network cannot influence the frequency stability. The phase shift introduced in the phase-rotating network by the control signal leads to a change in the oscillator frequency.

The phase detector used in the voltage-controlled oscillator according to the invention has a phase sensitivity which is accurately determined and is independent of temperature. This has the advantage that the relationship between the control signal and the phase shift introduced is also established accurately at the same time and becomes independent of temperature. It goes without saying that for the phase detector it is possible to choose a type of which the input-output relation is already independent of temperature per se, but that the temperature independence can also be obtained by feeding in a temperature correction signal via the adder circuit. In both cases this transfer function is called temperature-independent.

The relationship between the frequency variation of the oscillator 1 and the phase shift in the phase-rotating network 2 is determined entirely by the characteristics of the frequency-determining element 3. In this embodiment the relationship between frequency variation and control voltage is therefore also determined entirely by the characteristics of the above-mentioned element. The effect of the inaccuracy and temperature sensitivity of the elements of the phase-rotating network is virtually entirely eliminated.

Figure 3:
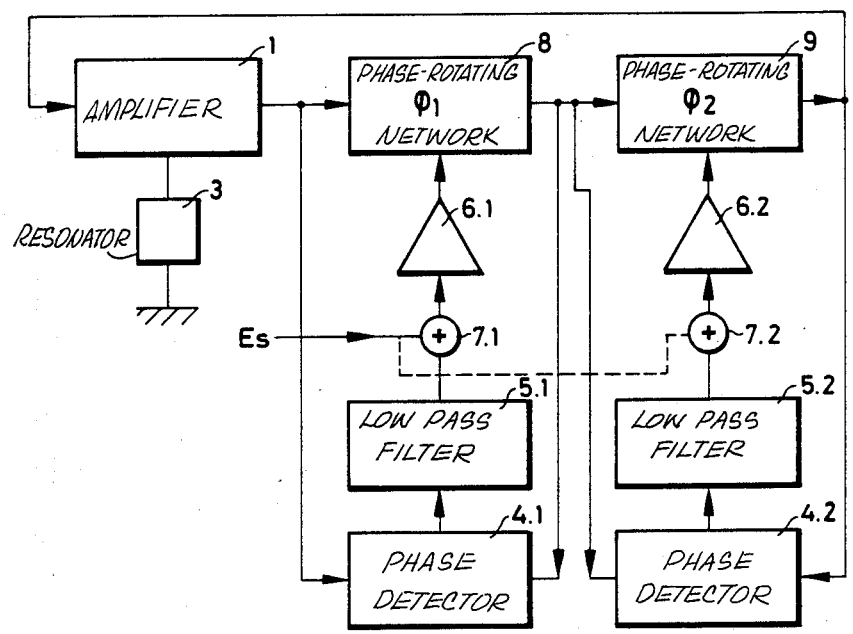
FIG. 3 gives a diagram of a second embodiment of the oscillator according to the invention.

In a further embodiment shown in FIG. 3 the phase-rotating network in the oscillator loop comprises two phase-rotating subnetworks 8, 9 which are connected in cascade and which produce a phase rotation $\phi_1$ and $\phi_2$ respectively. A control loop is now added to the two subnetworks separately, which has the same structure as that in FIG. 2, i.e. with respectively a phase detector 4.1, 4.2, a low-pass filter 5.1, 5.2, an adder 7.1, 7.2 and an amplifier 6.1, 6.2. In this way a phase rotation of 0 or $\pm\pi/2$ can be achieved in the idling situation in both subnetworks by selecting for the phase detector a type which for one of these phase rotations generates an output voltage or output current equal to zero. A phase rotation equal to 0 or $\pm\pi$ is produced in this way in the cascade of the subnetworks. The control of the frequency can be carried out in the same way as in FIG. 2. The control voltage Es can, however, now be fed into one loop or into both loops.

It goes without saying that the phase rotation in the sub-networks 8 and 9 in the idling situation can also be adjusted to a value other than 0 or $\pm\pi/2$ depending on the phase detectors used in the associate control loops. It also goes without saying that more than two of the above-mentioned phase-rotating subnetworks can be provided in the oscillator loop, an associate control loop being added to each subnetwork. A phase rotation equal to 0 or $\pm\pi$ must, however, always be produced in the cascade of the phase-rotating subnetworks, something which can be achieved by a suitable selection of the phase detectors in the control loops. The control voltage can now be fed into one or more loops.

Figure 4:
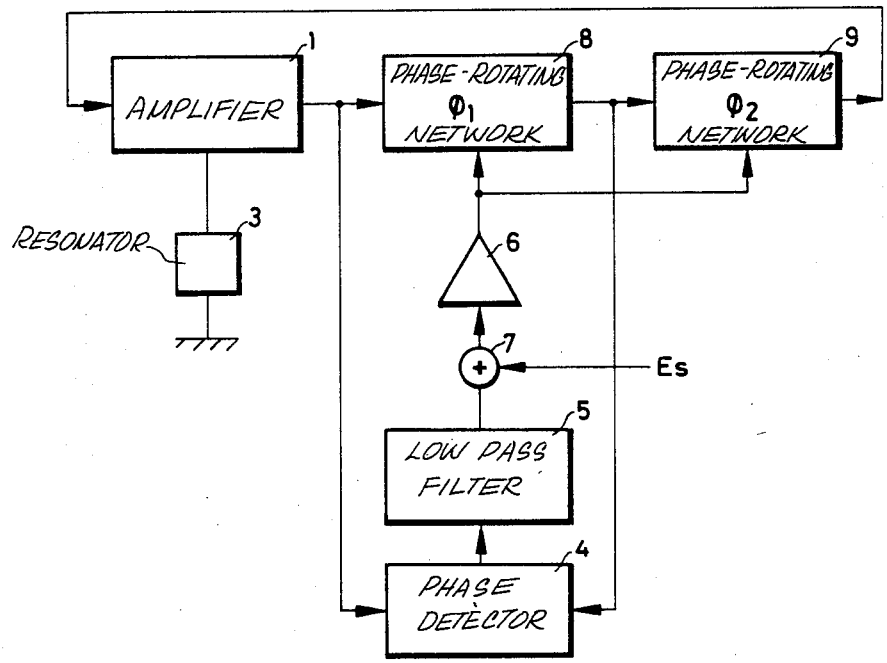
FIG. 4 gives a diagram of a third embodiment of the oscillator according to the invention.

In another embodiment shown in FIG. 4 the phase-rotating network also comprises two subnetworks 8, 9 which are connected in cascade, but use is made of only one control loop which, in the idling situation, regulates the phase rotation in the first subnetwork to a value of 0 or $\pm\pi/2$, using the same type of phase detector as in FIG. 3. The second subnetwork 9 is controlled with the same voltage or current as that for the first subnetwork 8. The control signal for the subnetwork 9 can also be derived via a conversion circuit from the control signal for the subnetwork 8.

The design of the phase-rotating subnetwork 9 is such that the characteristics thereof are largely identical to those of the phase-rotating network 8. Therefore, the phase rotation in the idling situation will also be equal to 0 or $\pm\pi/2$ in the network 9, and the phase rotation of the two cascaded networks is 0 or $\pm\pi$.

It is obvious that the phase rotation in the two subnetworks 8 and 9 in the idling situation can also be adjusted to a value other than 0 or $\pm\pi/2$ depending on the phase detector used in the control loop. The connection between the phase rotation in both phase-rotating networks 8 and 9 must be such for this that, in the idling situation, a phase rotation equal to 0 or $\pm\pi$ is produced in the cascade of the networks 8 and 9. It is also obvious that more than two phase-rotating subnetworks can be provided in the oscillator loop, the connection between the phase-rotating subnetworks having to be such that, in the idling situation, the phase rotation in the cascade of the phase-rotating subnetworks is adjusted to a value of 0 or $\pm\pi$.

Figure 5:
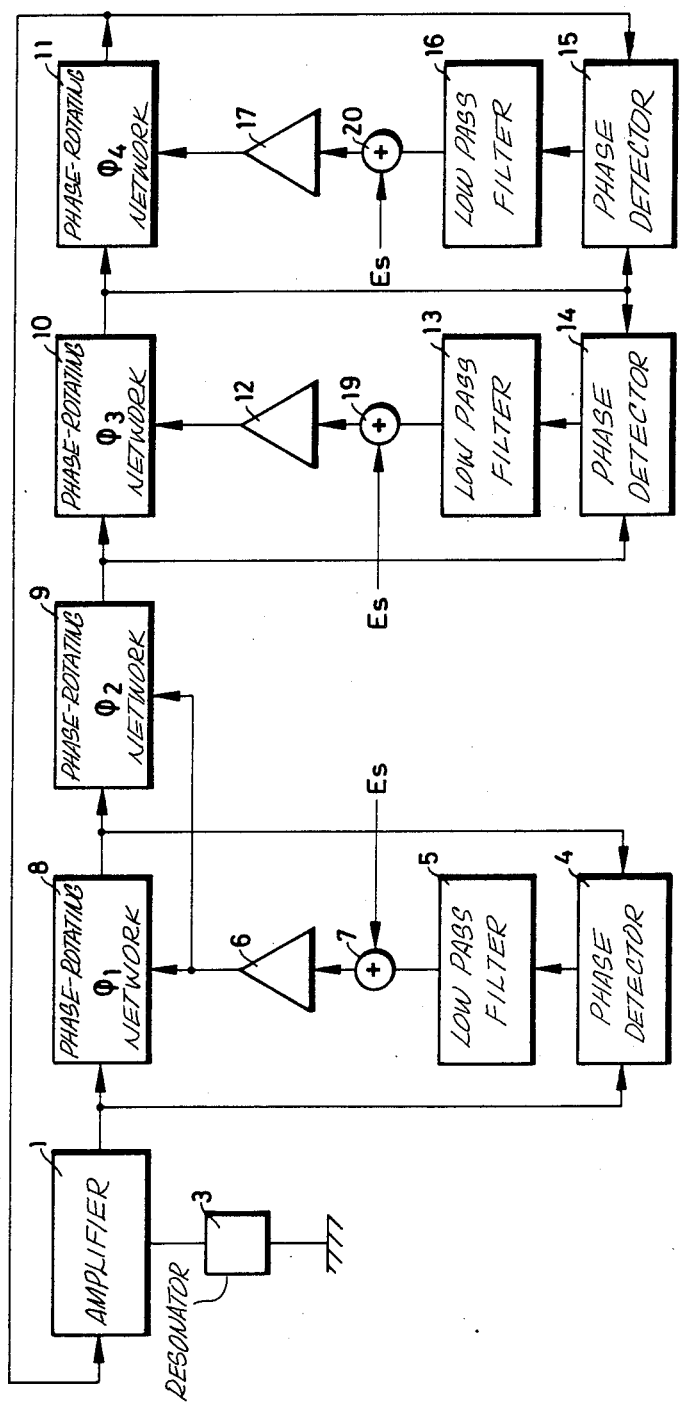
FIG. 5 gives a diagram of a fourth embodiment of the oscillator according to the invention.

FIG. 5 shows a possible embodiment representing a combination of the embodiments shown in FIGS. 3 and 4. It is obvious that the connection between the phase-rotating networks 8 and 9 must be such that, together with a suitable choice of the phase detectors 4, 14 and 15, the phase rotation of the subnetworks 8, 9, 10 and 11 connected in cascade is adjusted to a value of 0 or $\pm\pi$ in the idling situation. The control signal can now be presented via the adders 7, 19, 20 to one or more inputs of the amplifiers 6, 12 and 17 respectively.

Figure 6:
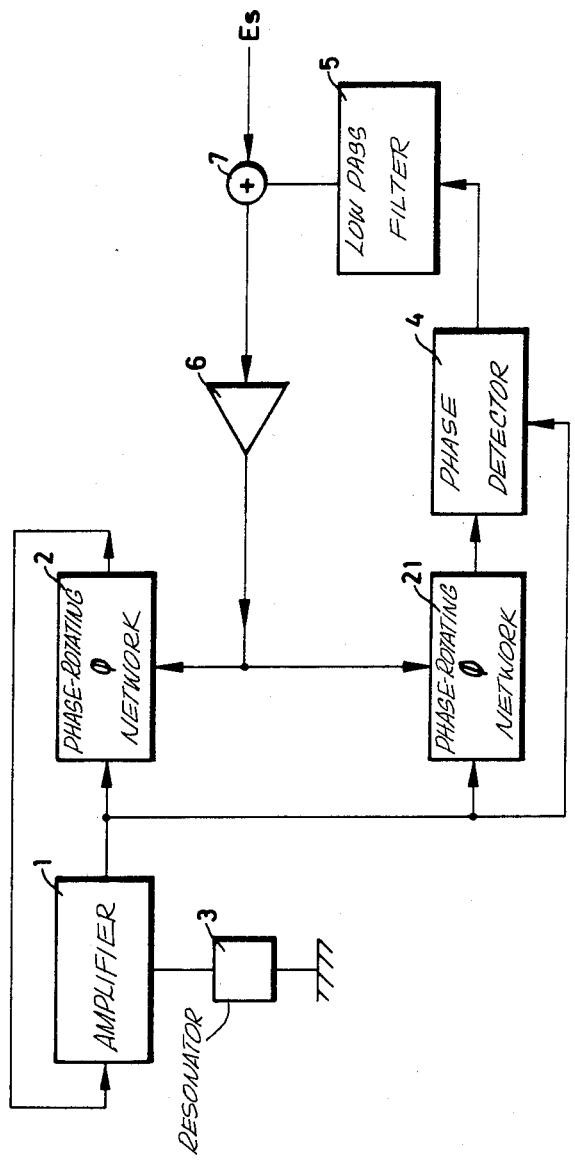
FIG. 6 gives a diagram of a fifth embodiment of the oscillator according to the invention.

In yet another embodiment shown in FIG. 6, the oscillator loop, as in FIG. 1, has a controlled first phase-rotating network 2, but use is made of a phase control loop which adjusts the phase rotation of a second phase-rotating network 21—not incorporated in the oscillator loop and to which the same oscillator signal is fed as that to the first network 2—to a value of 0 or $\pm\pi$ in the idling situation. Both phase-rotating networks 2, 21 have essentially identical behavior. The control signal which is presented via the phase control loop to the second network is also added possibly via a suitable conversion circuit—to the first network, so that in the idling situation the phase rotation becomes also equal to 0 or $\pm\pi$ in the first network. The control signal here can be presented via a suitable adder circuit to the input of the amplifier 6.

It goes without saying that in the idling situation the phase rotation in the network 21 can be adjusted to a value other than 0 or $\pm\pi$, depending on the phase detector 4 used. However, the connection between the phase-rotating networks must then be such that in the idling situation the phase rotation in the network 2 is adjusted to a value of 0 or $\pm\pi$.

It also goes without saying that the voltage-controlled oscillator of FIG. 6 can be supplemented in such a way that a layout which is comparable to that of FIGS. 3, 4 and 5 is obtained. In other words, in FIG. 6 several phase-rotating networks can be provided in cascade in the oscillator loop and/or several phase-rotating networks can be provided in cascade in the phase control loop.

An oscillator according to the invention can be adapted to other purposes if a non-linear network is provided in the input connection of the control input(s) of said oscillator. For example, with a suitable choice of the non-linear characteristic of the said network a linear frequency modulation of the oscillator can be obtained by feeding the signal to be modulated to said non-linear network. In another suitable form of this non-linear characteristic, compensation for the frequency drift of the oscillator with the temperature can be achieved by feeding a signal from a temperature sensor to this non-linear network.

If different frequency-determining elements, e.g. crystals, are used in the oscillator for these two cases of non-linear operation, individual adjustment will be necessary for the relation between phase and frequency in the case of the linear VCO and for the relation between temperature and frequency in the case of the TCO. Due to the fact that these relations are no longer also determined by the phase-rotating network, but solely by the characteristics of the crystal, one can forecast much better than in the currently known circuits what form the non-linearity should have. For example, the relation between phase and frequency is now determined by the phase characteristic of the crystal which is approximated, in the region of the series resonance frequency, by $\phi = -\mathrm{arctg}\, vQ$, in which $v=$ the detuning relative to the resonance frequency and Q is the quality factor of the crystal. The form of the non-linearity necessary for obtaining a linear frequency modulation is thus known. The network which achieves this non-linearity can thus in principle be implemented—for example, using the known and accurate mathematical relationships between currents and voltages in semi-conductor components in such a way that it only requires an adjustment which can be calculated on the basis of a measurement of the quality factor of the crystal. Such an adjustment can be achieved by means of one or more continuously adjustable elements, for example, a potentiometer, or with one or more elements or subnetworks which can be set in discrete steps, such as series and/or parallel circuits.

In another embodiment of the oscillator according to the invention the setting of the incremental sensitivity of the oscillator can be carried out automatically. For this purpose, use can be made of a subcircuit, known per se, in an oscillator with which a certain signal size is related to the quality factor of the frequency-determining element. The quality Q of the frequency-determining element, for example a crystal, is measured using an amplitude detector in the oscillator. The measured value obtained can then be fed to the control input of the earlier mentioned nonlinear network in the phase control loop for the achievement of the desired setting.

The relationship between temperature and frequency depends on the angle of cut of the crystal and is described by a power series. If this angle of cut is known, the above-mentioned relationship is also known. Thus the required coefficients can be calculated for different angles of cut, and the non-linearity of the non-linear network can be achieved, for example making use of known and accurate mathematical relationships between currents and voltages in semi-conductor components, in such a way that through a simple setting the desired form is obtained. This setting can be the same for all crystals of a particular manufacturing run and, as in the previous case, can be achieved either continuously or in a discrete manner in the non-linear network.

We claim:

1. Voltage-controlled oscillator having an oscillator loop provided with a frequency-determining element, an amplifier and a first phase-rotating network having a control input, in which network the value of one or more elements depends on a control signal which is fed to the control input of the phase-rotating network and with which the phase rotation, and thereby the oscillator frequency, can be changed, the oscillator providing an oscillator signal, characterized by a phase control loop, at least including the phase-rotating network to the input of which the oscillator signal is fed, a phase detector having two inputs for receiving an input signal and an output signal of the phase-rotating network, and an amplifier for amplifying the output signal of the phase detector and feeding it to the control input of the phase-rotating network, the phase detector having an accurately known and temperature-independent input-output relation.

2. Voltage-controlled oscillator according to claim 1, characterized in that at least a second phase-rotating network having a control input is provided, which is disposed solely in the phase control loop, and that a control signal for both the control input of the phase-rotating network in the oscillator loop and the control input of the phase-rotating network in the phase control loop is taken from the output of the amplifier in the phase control loop.

3. Voltage-controlled oscillator according to claim 2, characterized in that the phase-rotating network of the oscillator loop and the phase-rotating network of the phase control loop have essentially identical behavior.

4. Voltage-controlled oscillator according to claim 1, characterized in that a low-pass filter is provided in the phase control loop between the output of the phase detector and the input of the amplifier.

5. Voltage-controlled oscillator according to claim 1, characterized in that the input connection of the phase control loop amplifier contains an adder circuit, one input of which is fed by the signal of the phase detector for amplification, and the outer input of which forms the control input of the oscillator and to which a control signal coming from an external source can be fed to change the oscillator frequency.

6. Voltage-controlled oscillator according to claim 5, characterized in that, in series with the control input, a non-linear network is provided, to the input of which a modulating signal is fed, so that a linear frequency modulation of the oscillator is obtained.

7. Voltage-controlled oscillator according to claim 6, characterized in that the non-linearity of the non-linear network is set by means of one or more continuously adjustable elements and/or one or more subnetworks which are adjustable in discrete steps.

8. Voltage-controlled oscillator according to claim 5, characterized in that, in series with the control input, a non-linear network is provided, to the input of which a signal from a temperature sensor is fed, so that temperature compensation for the frequency drift of the oscillator is obtained.

9. Voltage-controlled oscillator according to claim 8, characterized in that the non-linearity of the non-linear network is set by means of one or more continuously adjustable elements and/or one or more subnetworks which are adjustable in discrete steps.

10. Voltage-controlled oscillator according to claim 8, characterized in that, in series with the control input, a non-linear network is provided, and for measurement of the quality factor of the frequency-determining element provision is made for an amplitude detector, the output measured value of which is fed to the input of the non-linear network for automatic setting of the non-linearity of the frequency-determining element.

11. Voltage-controlled oscillator according to claim 10, characterized in that the non-linearly of the non-linear network is set by means of one or more continuously adjustable elements and/or one or more subnetworks which are adjustable in discrete steps.

12. Voltage-controlled oscillator having an oscillator loop provided with a frequency-determining element, an amplifier and at least first and second phase-rotating networks each having a control input, wherein in each network the value of one or more elements depends on a control signal which is fed to the control input and with which the phase rotation, and thereby the oscillator frequency, can be changed, the oscillator providing an oscillator signal, characterized by a phase control loop, including at least one of the phase-rotating networks receiving at its input the oscillator signal, a phase detector having two inputs for receiving an input signal and an output signal of the at least one phase-rotating network, and an amplifier for amplifying the output signal of the phase detector and feeding it to the control input of the at least one phase-rotating network, the phase detector having an accurately known and temperature-independent input-output relation, wherein the first and second phase-rotating networks are disposed in cascade.

13. Voltage-controlled oscillator according to claim 12, characterized in that a control signal for both the first and second phase-rotating networks in the oscillator loop is taken from the output of the phase control loop amplifier.

* * * * *

UNITED STATES PATENT AND TRADEMARK OFFICE
CERTIFICATE OF CORRECTION

PATENT NO.  :  4,916,412
DATED       :  April 10, 1990
INVENTOR(S) :  E.H. Nordholt; H.C. Nauta It is certified that error appears in the above-identified patent and that said Letters Patent is hereby corrected as shown below:

On the Front Page:

[73] Assignee; change "Nederlandsch Octrooibureau, The Hague, Netherlands: to -- Catena Microelectronics BV, Delft, the Netherlands --

In the Specification

Column 1, line 26, after "oscillating" delete the comma.
Column 1, line 34, change "controllability" to -- controlability --.

Column 2, line 43, change "tempera ture" to -- temperature --.

Column 4, line 12, after "For" delete the comma.
Column 4, line 67, change "sub-networks" to -- subnetworks --.

UNITED STATES PATENT AND TRADEMARK OFFICE
CERTIFICATE OF CORRECTION

PATENT NO. : 4,916,412

DATED : April 10, 1990

INVENTOR(S) : E. H. Nordholt; H. C. Nauta

It is certified that error appears in the above-identified patent and that said Letters Patent is hereby corrected as shown below:

In the Claims

Column 7, line 57, change "outer" to -- other --.

Signed and Sealed this

Third Day of September, 1991

Attest:

HARRY F. MANBECK, JR.

*Attesting Officer*  *Commissioner of Patents and Trademarks*